(12) United States Patent
Kang (10) Patent No.: US 9,305,987 B2
(45) Date of Patent: Apr. 5, 2016

(54) ORGANIC LIGHT EMITTING DIODE DISPLAY

(71) Applicant: Samsung Display Co., Ltd., Gyeonggi-do (KR)

(72) Inventor: Chang-Wook Kang, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/074,921

(22) Filed: Nov. 8, 2013

(65) Prior Publication Data

US 2014/0319480 A1     Oct. 30, 2014

(30) Foreign Application Priority Data

Apr. 26, 2013  (KR) .......................... 10-2013-0046776

(51) Int. Cl.
| | | |
|---|---|---|
| *H01L 51/05* | (2006.01) | |
| *H01L 27/32* | (2006.01) | |
| *H01L 27/12* | (2006.01) | |

(52) U.S. Cl.
CPC ........ *H01L 27/3262* (2013.01); *H01L 27/1218* (2013.01); *H01L 27/1237* (2013.01); *H01L 27/1248* (2013.01); *H01L 27/1255* (2013.01); *H01L 27/1262* (2013.01)

(58) Field of Classification Search
CPC ............ H01L 51/0545; H01L 51/0036; H01L 51/0541; H01L 51/5012; B82Y 10/00
USPC ......................... 257/40; 438/82, 99
See application file for complete search history.

(56) References Cited

U.S. PATENT DOCUMENTS

| | | | | |
|---|---|---|---|---|
| 5,831,284 A | * | 11/1998 | Park ................. | G02F 1/136213 257/296 |
| 2007/0238227 A1 | * | 10/2007 | Jun .................... | H01L 27/1255 438/149 |
| 2010/0019996 A1 | * | 1/2010 | You .................... | H01L 27/1214 345/76 |
| 2010/0025664 A1 | * | 2/2010 | Park .................... | H01L 27/326 257/40 |
| 2011/0223697 A1 | * | 9/2011 | Yong-Hwan ........ | H01L 27/1266 438/28 |
| 2012/0032163 A1 | * | 2/2012 | Yamazaki ......... | 257/43 |
| 2012/0080681 A1 | * | 4/2012 | Kim ................. | H01L 27/1222 257/59 |
| 2012/0098008 A1 | * | 4/2012 | Song ................. | H01L 27/3258 257/98 |
| 2013/0037913 A1 | * | 2/2013 | Chen .................. | C23C 16/405 257/532 |
| 2013/0215491 A1 | * | 8/2013 | Choi et al. ............. | 359/290 |

FOREIGN PATENT DOCUMENTS

| | | |
|---|---|---|
| JP | 2007-139851 | 6/2007 |
| KR | 10-2006-0114459 A | 11/2006 |
| KR | 10-2011-0110597 A | 10/2011 |

* cited by examiner

*Primary Examiner* — Allen Parker
*Assistant Examiner* — Didarul Mazumder
(74) *Attorney, Agent, or Firm* — Lee & Morse, P.C.

(57) ABSTRACT

A pixel includes a capacitor coupled to a transistor, a first insulating layer over a semiconductor layer of the transistor, a second insulating layer over the first insulating layer, and a blocking layer between the first insulating layer and the second insulating layer. The first plate of the capacitor is on the first insulating layer and a second plate of the capacitor on the second insulating layer. The blocking layer may be made of a natural oxide layer and the first insulating layer may be made of a material different from the blocking layer.

20 Claims, 6 Drawing Sheets

ORGANIC LIGHT EMITTING DIODE DISPLAY

CROSS-REFERENCE TO RELATED APPLICATION

Korean Patent Application No. 10-2013-0046776 filed on Apr. 26, 2013, in the Korean Intellectual Property Office, and entitled: "ORGANIC LIGHT EMITTING DIODE DISPLAY," is incorporated by reference herein in its entirety.

BACKGROUND

1. Field

Embodiments herein relate to an organic light emitting diode (OLED) display.

2. Description of the Related Art

An organic light emitting diode display includes a plurality of pixels, each of which includes a pixel circuit that controls an amount of current supplied to an OLED. The amount of current supplied to the OLED is determined based on an arrangement of capacitors and transistors, the latter of which include at least a switching transistor and a driving transistor. The amount of current supplied to through driving transistor determines a grayscale value of light to be emitted.

In order to meet the ever-increasing demand for higher resolution displays, integration techniques have been employed. These techniques include reducing the size of each pixel. Reducing pixel size allows the pixels to be driven with a lower amount of current. However, the power consumption savings realized by this lower current is at least partially offset by a reduction in the range of gate voltages that can be used to drive the switching and driving transistors. It is difficult to adjust the magnitude of the gate voltage applied to the driving transistor so as to retain a manageable grayscale range.

SUMMARY

In accordance with one embodiment, an organic light emitting diode display includes a substrate; a semiconductor layer on the substrate and including a switching semiconductor layer and a driving semiconductor layer separated from each other; a first gate insulating layer over the semiconductor layer; a switching gate electrode on the first gate insulating layer and overlapping the switching semiconductor layer; a second gate insulating layer over the switching gate electrode; a driving gate electrode on the second gate insulating layer and overlapping the driving semiconductor layer; and an interlayer insulating layer over the driving gate electrode and the second gate insulating layer. The second gate insulating layer includes a second lower gate insulating layer on the first gate insulating layer, a crack blocking layer on the second lower gate insulating layer, and a second upper gate insulating layer on the crack blocking layer. The crack blocking layer includes a natural oxide layer.

Also, the substrate may include a polyimide layer and/or a barrier layer between the substrate and the semiconductor layer.

Also, a storage capacitor may include a first plate on the first gate insulating layer and a second plate on the second gate insulating layer overlapping the first plate.

Also, the display may include a scan line on the substrate and transmitting a scan signal; a data line and a driving voltage line crossing the scan line, the data line and driving voltage line respectively transmitting a data signal and a driving voltage; a switching transistor coupled to the scan line and the data line, the switching transistor including the switching semiconductor layer and the switching gate electrode; a driving transistor coupled to the switching drain electrode of the switching transistor, the driving transistor including the driving semiconductor layer and the driving gate electrode; and an organic light emitting diode coupled to the driving drain electrode of the driving transistor.

In accordance with another embodiment, a pixel includes a transistor; a capacitor coupled to the transistor; a first insulating layer over a semiconductor layer of the transistor; a second insulating layer over the first insulating layer; and a blocking layer between the first insulating layer and the second insulating layer, wherein a first plate of the capacitor is on the first insulating layer and a second plate of the capacitor on the second insulating layer, and wherein the blocking layer is made of a natural oxide layer and the first insulating layer is made of a material different from the blocking layer.

Also, the semiconductor layer includes a switching semiconductor layer spaced from a driving semiconductor layer, wherein the switching semiconductor layer or the driving semiconductor layer corresponds to the transistor coupled to the capacitor. Also, the transistor may be a switching transistor of the pixel.

Also, the pixel may include a driving transistor, wherein the first and second insulating layers are gate insulating layers of the driving transistor.

Also, the pixel may include a gate electrode on the first insulating layer. The second insulating layer may be over the gate electrode. Also, the driving transistor includes a gate electrode, the gate electrode may include on the first insulating layer, and the second insulating layer may be over the gate electrode. The first insulating layer may include silicon, and an organic light emitting diode may be coupled to at least one node of the capacitor.

In accordance with another embodiment, a pixel includes a driving transistor, a switching transistor; a capacitor between a node of the switching transistor and a node of the driving transistor; a first insulating layer over a semiconductor layers of the switching and driving transistors; a second insulating layer over the first insulating layer; a blocking layer between the first and second insulating layers, wherein a first plate of the capacitor is on the first insulating layer and a second plate of the capacitor on the second insulating layer.

Also, the blocking layer may be made from a material which prevents a crack in the first insulating layer from migrating to the second insulating layer. In one implementation, the blocking layer is made of a natural oxide layer and the first insulating layer is made of a material different from the blocking layer. Also, the first and second insulating layers may be insulating layers of a switching or driving transistor gate. Another insulating layer may be between the blocking layer and first capacitor plate.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
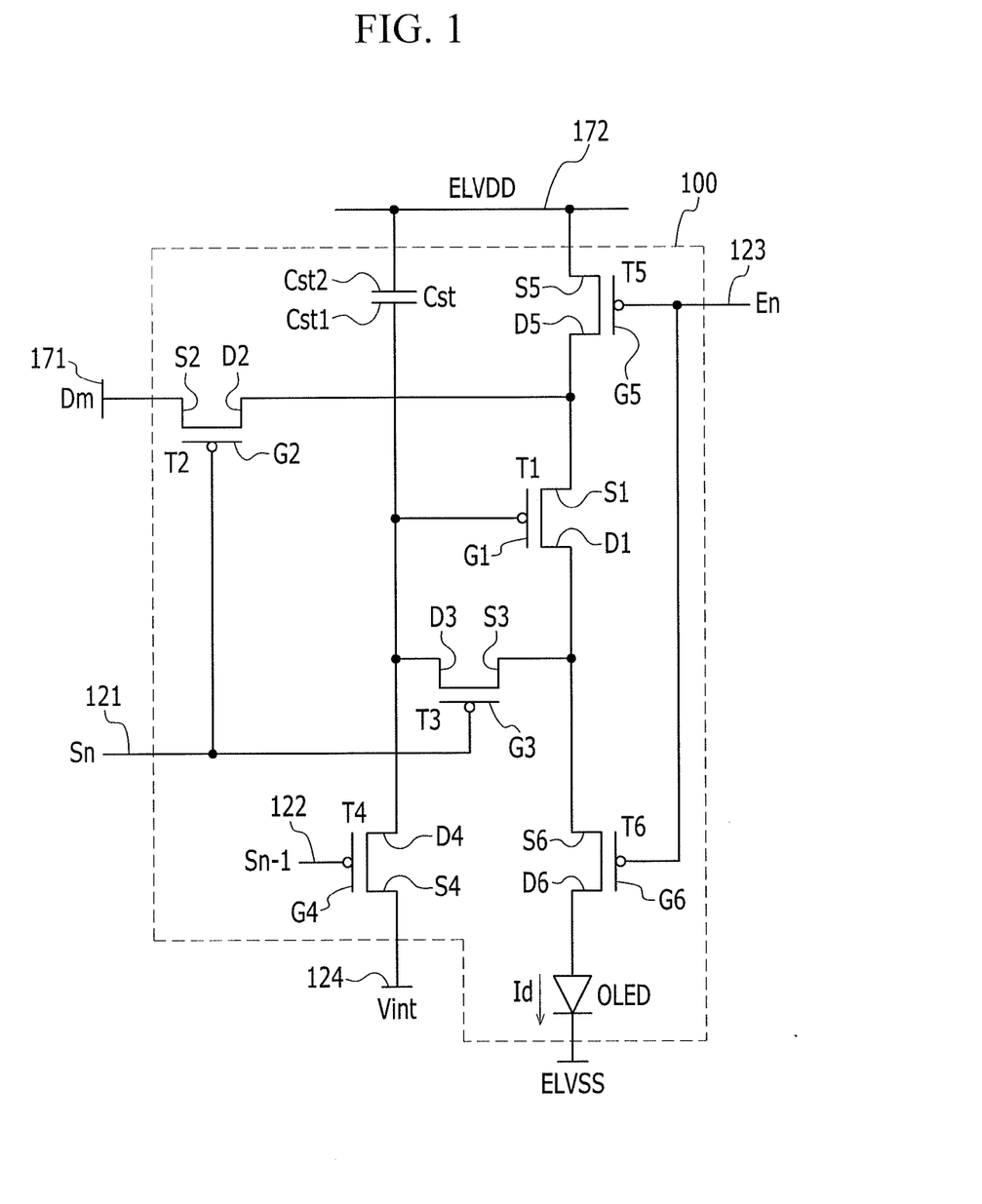
FIG. 1 illustrates one embodiment of a pixel of an organic light emitting diode display.

FIG. 1 illustrates an embodiment of an equivalent circuit of a pixel 100 of an organic light emitting diode (OLED) display. As shown in FIG. 1, pixel 100 includes a plurality of signal lines 121, 122, 123, 124, 171, and 172, and a plurality of transistors T1, T2, T3, T4, T5, and T6, storage capacitors Cst, and organic light emitting diodes (OLED) connected to the plurality of signal lines.

The transistors include a driving transistor (driving thin film transistor) T1, a switching transistor (switching thin film transistor) T2, a compensation transistor T3, an initialization transistor T4, an operation control transistor T5, and a light emission control transistor T6.

The signal lines include a scan line 121 transferring a scan signal Sn, a prior scan line 122 transferring a prior scan signal Sn-1 to the initialization transistor T4, a light emission control line 123 transferring a light emission control signal En to the operation control transistor T5 and the light emission control transistor T6, a data line 171 crossing the scan line 121 and transferring a data signal Dm, a driving voltage line 172 transferring a driving voltage ELVDD and formed almost parallel to the data line 171, and an initialization voltage line 124 transferring an initialization voltage Vint initializing the driving transistor T1.

A gate electrode G1 of the driving transistor T1 is connected to an end Cst1 of the storage capacitor Cst and a source electrode S1 of the driving transistor T1 is connected, via the operation control transistor T5, to the driving voltage line 172. A drain electrode D1 of the driving transistor T1 is electrically connected, via the light emission control transistor T6, to an anode of the organic light emitting diode (OLED). The driving transistor T1 receives the data signal Dm according to switching operation of the switching transistor T2 and supplies a driving current Id to the organic light emitting diode (OLED).

A gate electrode G2 of the switching transistor T2 is connected to the scan line 121. A source electrode S2 of the switching transistor T2 is connected to the data line 171. A drain electrode D2 of the switching transistor T2 is connected, via the operation control transistor T5, to the driving voltage line 172, while also being connected to the source electrode S1 of the driving transistor T1. The switching transistor T2 is turned on according to the scan signal Sn transferred through the scan line 121, to perform a switching operation of transferring the data signal Dm transferred to the data line 171 to the source electrode of the driving transistor T1.

A gate electrode G3 of the compensation transistor T3 is connected to the scan line 121. A source electrode S3 of the compensation transistor T3 is connected, via the light emission control transistor T6, to the anode of the organic light emitting diode (OLED), while also being connected to the drain electrode D1 of the driving transistor T1. A drain electrode D3 of the compensation transistor T3 is connected to the first end Cst1 of the storage capacitor Cst. A drain electrode D4 of the initialization transistor T4. The gate electrode G1 of the driving transistor T1. The compensation transistor T3 is turned on according to the scan signal Sn transferred through the scan line 121, to connect the gate electrode G1 and the drain electrode D1 of the driving transistor T1 to each other, thus performing diode-connection of the driving transistor T1.

A gate electrode G4 of the initialization transistor T4 is connected to the prior scan line 122. A source electrode S4 of the initialization transistor T4 is connected to the initialization voltage line 124. A drain electrode D4 of the initialization transistor T4 is connected to the first end Cst1 of the storage capacitor Cst, the drain electrode D3 of the compensation transistor T3, and the gate electrode G1 of the driving transistor T1. The initialization transistor T4 is turned on according to the prior scan signal Sn-1 transferred through the prior scan line 122, to transfer the initialization voltage Vint to the gate electrode G1 of the driving transistor T1, thus performing an initialization operation for initializing the voltage of the gate electrode G1 of the driving transistor T1.

A gate electrode G5 of the operation control transistor T5 is connected to the light emission control line 123. A source electrode S5 of the operation control transistor T5 is connected to the driving voltage line 172. A drain electrode D5 of the operation control transistor T5 is connected to the source electrode S1 of the driving transistor T1 and the drain electrode S2 of the switching transistor T2.

A gate electrode G6 of the light emission control transistor T6 is connected to the light emission control line 123. A source electrode S6 of the light emission control transistor T6 is connected to the drain electrode D1 of the driving transistor T1 and the source electrode S3 of the compensation transistor T3. A drain electrode D6 of the light emission control transistor T6 is electrically connected to the anode of the organic light emitting diode (OLED). The operation control transistor T5 and the light emission control transistor T6 are simultaneously turned on according to the light emission control signal En transferred through the light emission control line 123, to transfer the driving voltage ELVDD to the organic light emitting diode (OLED), thus allowing the driving current Id to flow in the organic light emitting diode (OLED).

A second end Cst2 of the storage capacitor Cst is connected to the driving voltage line 172. A cathode of the organic light emitting diode (OLED) is connected to a common voltage ELVSS. Accordingly, the organic light emitting diode (OLED) receives the driving current Id from the driving transistor T1 to emit light, thereby displaying an image.

In operation, first, the prior scan signal Sn-1 of a low level is supplied through the prior scan line 122 during an initialization period. Then, the initialization transistor T4 is turned on corresponding to the prior scan signal Sn-1 of the low level, and the initialization voltage Vint is connected from the initialization voltage line 124 through the initialization transistor T4 to the gate electrode of the driving transistor T1 to initialize the driving transistor T1 by the initialization voltage Vint.

Subsequently, the scan signal Sn of the low level is supplied through the scan line 121 during a data programming period. Then, the switching transistor T2 and the compensation transistor T3 are turned on corresponding to the scan signal Sn of the low level. In this case, the driving transistor T1 is diode-connected by the turned-on compensation transistor T3, and biased in a forward direction.

Then, a compensation voltage Dm+Vth (Vth is a negative value), obtained by subtracting a threshold voltage Vth of the driving transistor T1 from the data signal Dm supplied from the data line 171, is applied to the gate electrode of the driving transistor T1.

The driving voltage ELVDD and the compensation voltage Dm+Vth are applied to respective ends of the storage capacitor Cst. A charge corresponding to a difference between voltages at the ends is stored in the storage capacitor Cst. Thereafter, the level of the light emission control signal En supplied from the light emission control line 123 during the light emission period is changed from the high level to the low level. Then, the operation control transistor T5 and the light emission control transistor T6 are turned on by the light emission control signal En of the low level during the light emission period.

Then, the driving current Id is generated according to a difference between the voltage of the gate electrode of the driving transistor T1 and the driving voltage ELVDD. The driving current Id is supplied through the light emission control transistor T6 to the organic light emitting diode (OLED). A gate-source voltage Vgs of the driving transistor T1 is maintained at (Dm+Vth)-ELVDD by the storage capacitor Cst during the light emission period. In one embodiment, the driving current Id may be proportional to a square of a value obtained by subtracting the threshold voltage from a source-gate voltage, that is, $(Dm-ELVDD)^2$, according to a current-voltage relationship of the driving transistor T1. Accordingly, the driving current Id is determined regardless of the threshold voltage Vth of the driving transistor T1.

Figure 2:
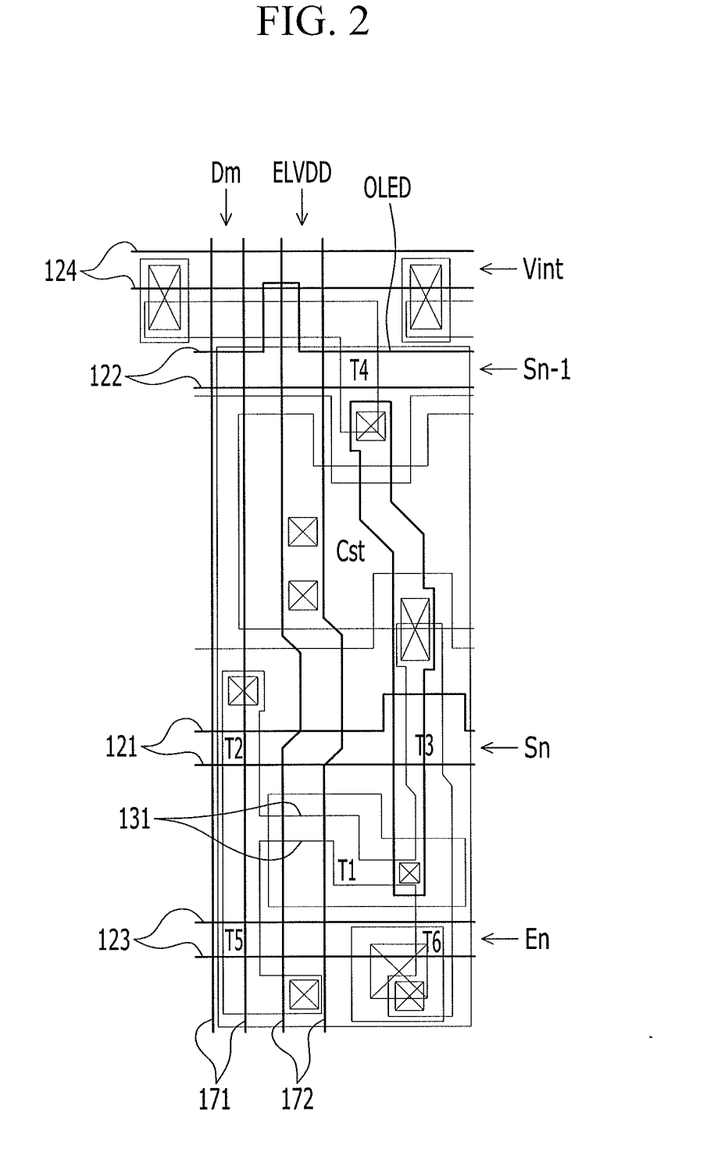
FIG. 2 illustrates transistors and capacitors of the display in FIG. 1.
Figure 3:
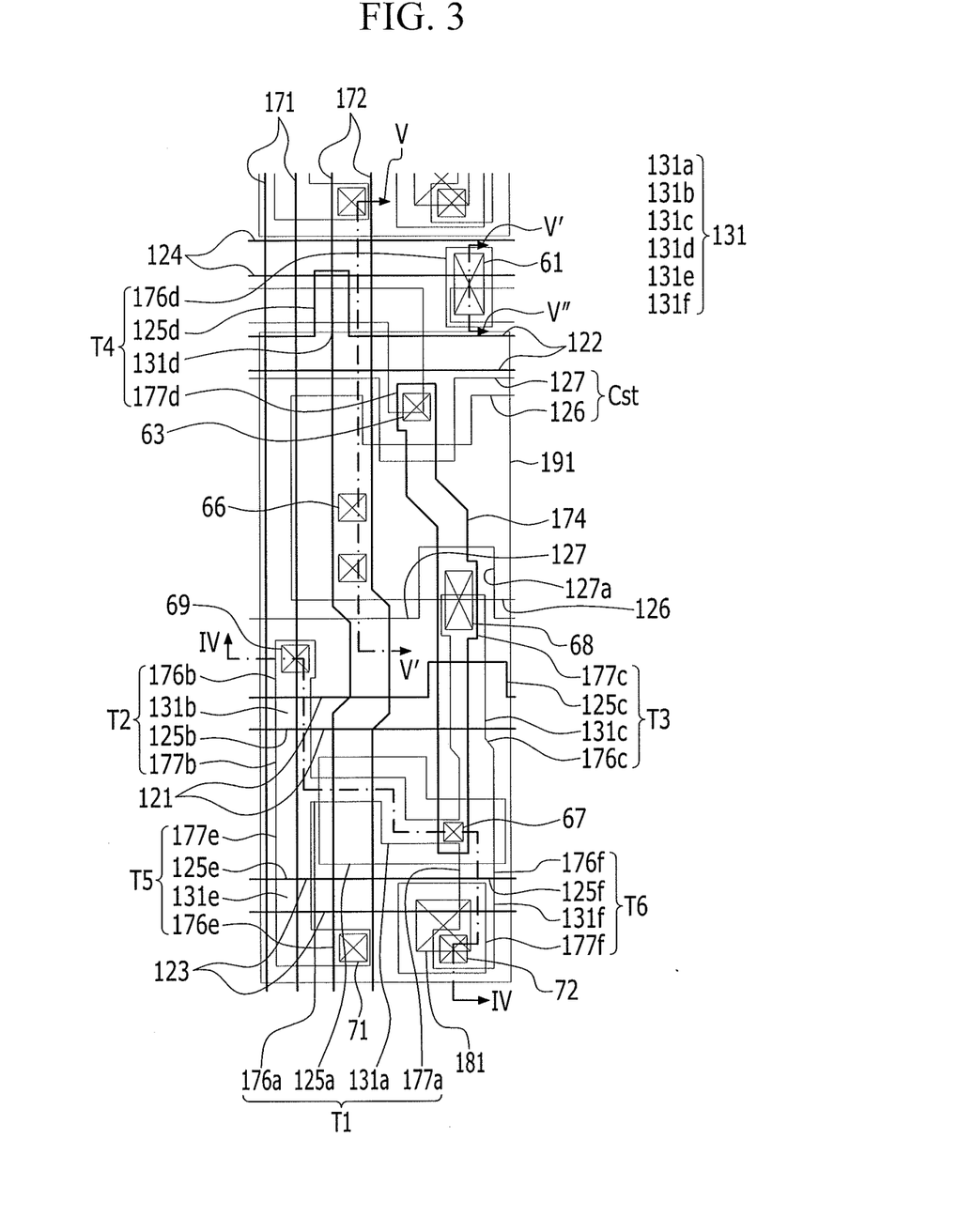
FIG. 3 illustrates a detailed layout view of one pixel of FIG. 2.
Figure 4:
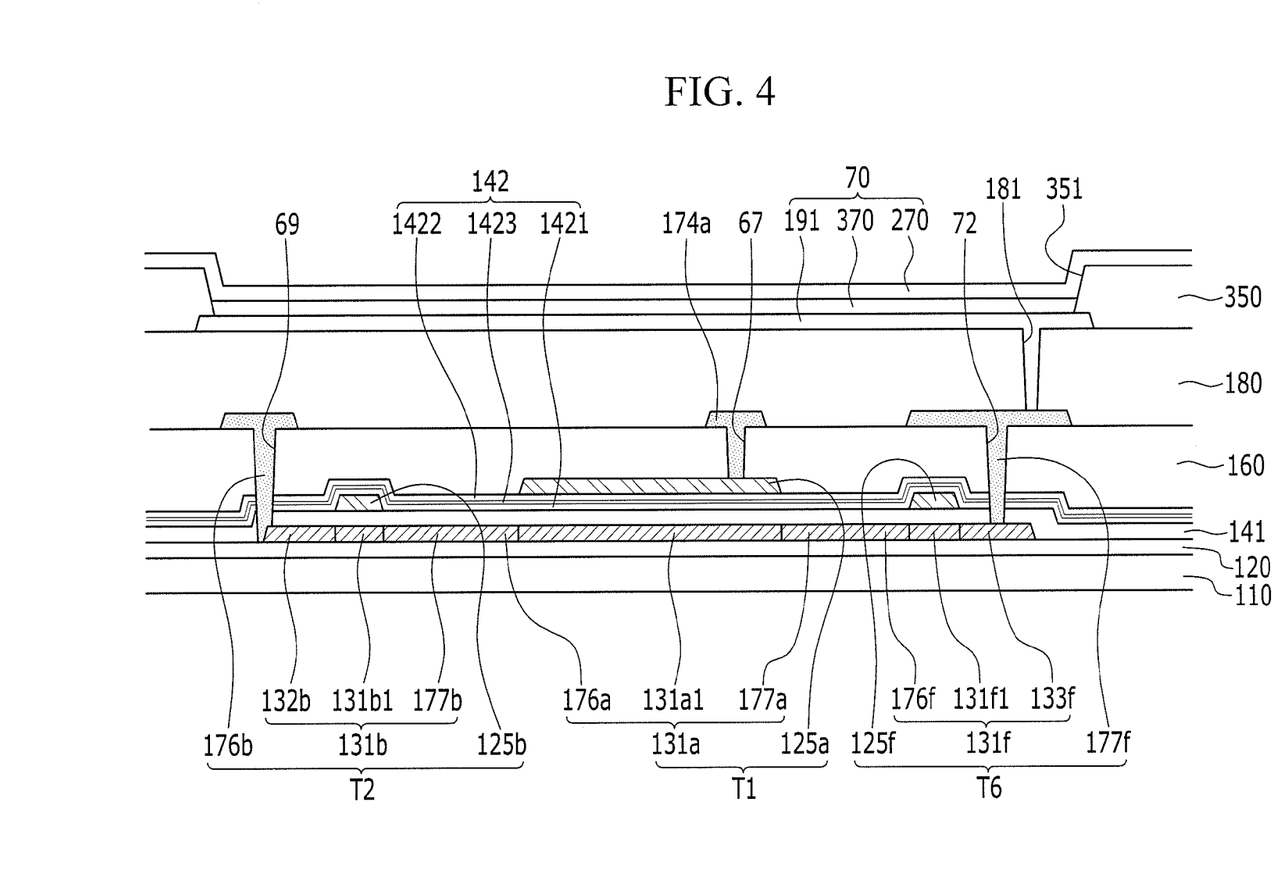
FIG. 4 illustrates a cross-sectional view of the display of FIG. 3 taken along line IV-IV.
Figure 5:
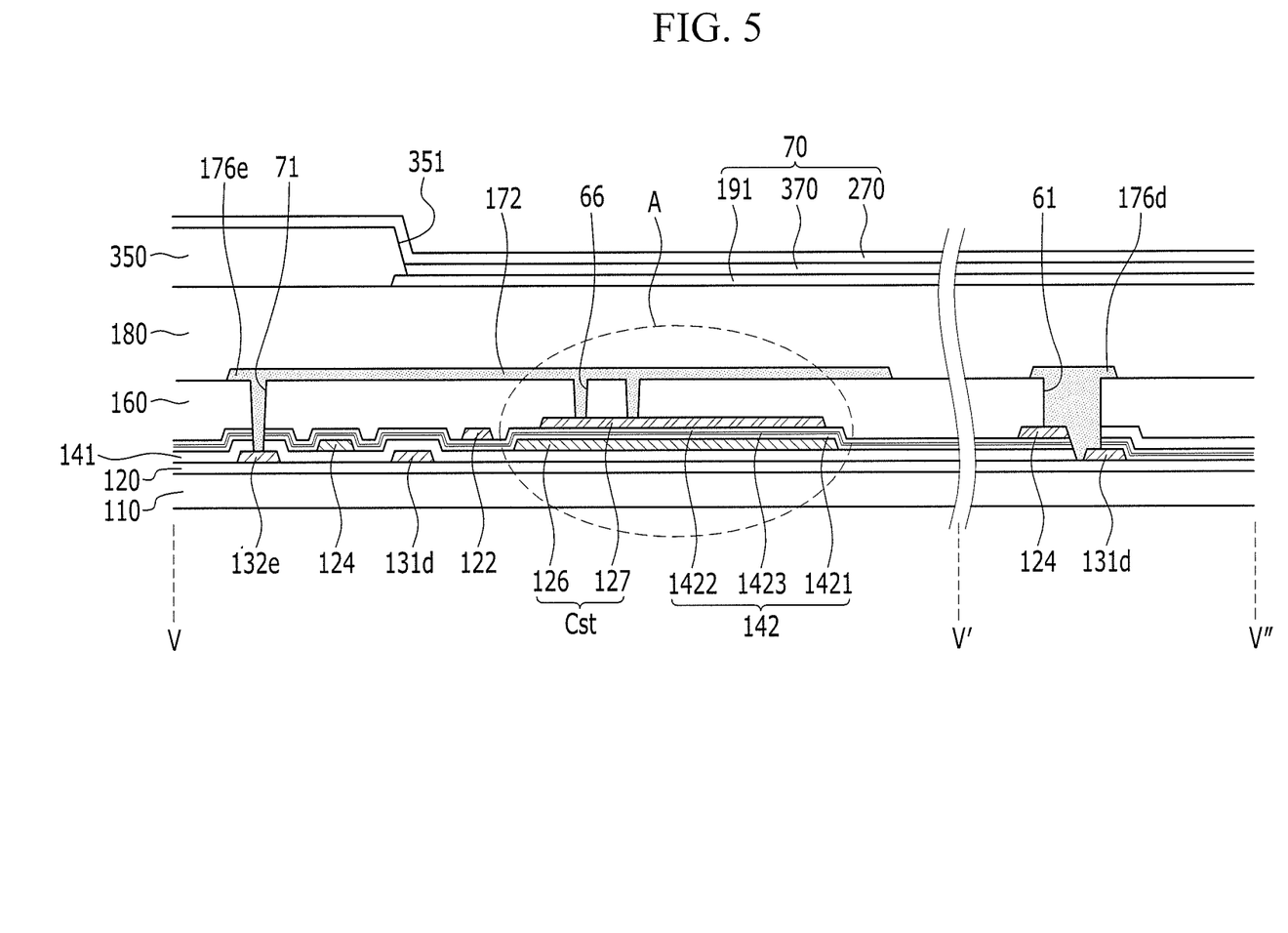
FIG. 5 illustrates a cross-sectional view of the display of FIG. 3 taken along line V-V' and line V'-V"
Figure 6:
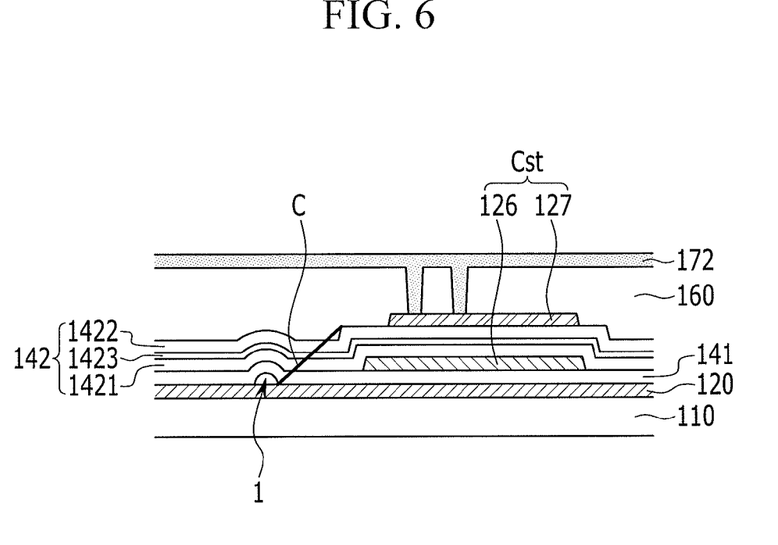
FIG. 6 illustrates an enlarged view of a crack blocking layer in area A of FIG. 5.

FIG. 2 illustrates one embodiment of an arrangement of transistors and capacitors of the organic light emitting diode display. FIG. 3 illustrates an example of a layout of one pixel in FIG. 2. FIG. 4 is a cross-sectional view of the organic light emitting diode display of FIG. 3 taken along line IV-IV. FIG. 5 is a cross-sectional view of the organic light emitting diode display of FIG. 3 taken along line V-V' and line V'-V". FIG. 6 is enlarged cross-sectional view of a portion A of FIG. 5 showing a state of blocking a crack by a crack blocking layer.

As shown in FIG. 2, the organic light emitting diode display according to one embodiment includes the scan line 121, the prior scan line 122, the light emission control line 123, and the initialization voltage line 124 applying the scan signal Sn, the prior scan signal Sn-1, the light emission control signal En, and the initialization voltage Vint, respectively. The scan lines may be formed in a row direction. The data line 171 and the driving voltage line 172 cross all of the aforementioned scan lines, and may respectively apply a data signal Dm and a driving voltage ELVDD to the pixel.

Further, the driving transistor T1, the switching transistor T2, the compensation transistor T3, the initialization transistor T4, the operation control transistor T5, the light emission control transistor T6, the storage capacitor Cst, and the organic light emitting diode (OLED) are formed in the pixel.

The driving transistor T1, the switching transistor T2, the compensation transistor T3, the initialization transistor T4, the operation control transistor T5, and the light emission control transistor T6 are formed along a semiconductor layer 131. In accordance with one embodiment, the semiconductor layer 131 is formed to be bent in any one of a variety of various shapes.

Also, the semiconductor layer 131 may be formed of polysilicon or an oxide semiconductor. The oxide semiconductor may include any one of oxides having titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as zinc oxide (ZnO), indium-gallium-zinc oxide a variety of shapes ($InGaZnO_4$), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—0), indium-germanium-gallium oxide (In—Ge—Ga—O), titanium-indium-zinc oxide (Ti—In—Zn—O), and hafnium-indium-zinc oxide (Hf—In—Zn—O). In the case where the semiconductor layer 131 is formed of the oxide semiconductor, a separate protective layer may be added to protect the oxide semiconductor that is weak with regard to an external environment such as high temperatures.

The semiconductor layer 131 includes a channel region, a source region, and a drain region. The channel region may be subjected to channel doping with an N-type impurity or a P-type impurity. The source region and the drain region are formed at respective sides of the channel region, and may be formed by doping a doping impurity in the channel region. The doping impurity has a conductivity type that is opposite to that of the doping impurity doped in the channel region.

A flat surface type of structure of the organic light emitting diode display according to one embodiment will now be described with reference to FIG. 2 and FIG. 3, and a lamination structure thereof will be described with reference to FIG. 4 and FIG. 5.

As shown in FIGS. 2 and 3, the pixel of the organic light emitting diode display according to one embodiment includes the driving transistor T1, the switching transistor T2, the compensation transistor T3, the initialization transistor T4, the operation control transistor T5, the light emission control transistor T6, the storage capacitor Cst, and the organic light emitting diode (OLED). The transistors T1, T2, T3, T4, T5, and T6 are formed along the semiconductor layer 131.

The semiconductor layer 131 includes a driving semiconductor layer 131a formed in the driving transistor T1, a switching semiconductor layer 131b formed in the switching transistor T2, a compensation semiconductor layer 131c formed in the compensation transistor T3, an initialization semiconductor layer 131d formed in the initialization transistor T4, an operation control semiconductor layer 131e formed in the operation control transistor T5, and a light emission control semiconductor layer 131f formed in the light emission control transistor T6.

The driving transistor T1 includes the driving semiconductor layer 131a, a driving gate electrode 125a, a driving source electrode 176a, and a driving drain electrode 177a. The driving source electrode 176a corresponds to a driving source region 176a doped with the impurity in the driving semiconductor layer 131a. The driving drain electrode 177a corresponds to a driving drain region 177a doped with the impurity in the driving semiconductor layer 131a. The driving gate electrode 125a overlaps the driving semiconductor layer 131a, and has an area that is larger than that of the driving semiconductor layer 131a.

The driving gate electrode 125a may be formed of the same material as the scan line 121, the prior scan line 122, the switching gate electrode 125b, the compensation gate electrode 125c, the initialization gate electrode 125d, and a second storage capacitive plate 127 on the same layer.

The switching transistor T2 includes the switching semiconductor layer 131b, a switching gate electrode 125b, a switching source electrode 176b, and a switching drain electrode 177b. The switching source electrode 176b is a portion protruding from the data line 171, and the switching drain electrode 177b corresponds to a switching drain region 177b doped with an impurity in the switching semiconductor layer 131b. The switching source electrode 176b is connected through a contact hole 69 to a switching source region 132b.

The compensation transistor T3 includes the compensation semiconductor layer 131c, a compensation gate electrode 125c, a compensation source electrode 176c, and a compensation drain electrode 177c. The compensation source electrode 176c corresponds to a compensation source region 176c doped with the impurity in the compensation semiconductor layer 131c. The compensation drain electrode 177c is a portion protruding from a connection member 174.

The initialization transistor T4 includes the initialization semiconductor layer 131d, an initialization gate electrode 125d, an initialization source electrode 176d, and an initialization drain electrode 177d. The initialization source electrode 176d is simultaneously connected through a contact hole 61. The contact hole may be continuously formed in a first gate insulating layer 141, a second gate insulating layer 142, and an interlayer insulating layer 160. The initialization source electrode 176d is connected, through this hole, to the initialization voltage line 124 and the initialization semiconductor layer 131d. The initialization drain electrode 177d is another end of the connection member 174 and is connected through a contact hole 63, which may be continuously formed in the first gate insulating layer 141, the second gate insulating layer 142, and the interlayer insulating layer 160. The initialization drain electrode 177d is connected, through contact hole 63, to the initialization semiconductor layer 131d.

The operation control transistor T5 includes the operation control semiconductor layer 131e, an operation control gate electrode 125e, an operation control source electrode 176e, and an operation control drain electrode 177e. The operation control source electrode 176e is a portion of the driving voltage line 172 and is connected through a contact hole 71 to an operation control source region 132e. The operation control drain electrode 177e corresponds to an operation control drain region 177e doped with the impurity in the operation control semiconductor layer 131e.

The light emission control transistor T6 includes the light emission control semiconductor layer 131f, a light emission control gate electrode 125f, a light emission control source electrode 176f, and a light emission control drain electrode 177f. The light emission control source electrode 176f corresponds to a light emission control source region 176f doped with the impurity in the light emission control semiconductor layer 131f.

An end of the driving semiconductor layer 131a of the driving transistor T1 is connected to the switching semiconductor layer 131b and the operation control semiconductor layer 131e. The other end of the driving semiconductor layer 131a is connected to the compensation semiconductor layer 131c and the light emission control semiconductor layer 131f. Therefore, the driving source electrode 176a is connected to the switching drain electrode 177b and the operation control drain electrode 177e. The driving drain electrode 177a is connected to the compensation source electrode 176c and the light emission control source electrode 176f.

The storage capacitor Cst includes a first plate 126 and the second plate 127 with the second gate insulating layer 142 interposed therebetween. The second gate insulating layer 142 is a dielectric material. A storage capacitance is determined by charges accumulated in the storage capacitor Cst and a voltage between the first and second plates 126 and 127.

The first plate 126 may be formed of the same material as the light emission control line 123, the initialization voltage line 124, the operation control gate electrode 125e, and the light emission control gate electrode 125f on the same layer. The second storage capacitive plate 127 may be formed of the same material as the scan line 121, the prior scan line 122, the driving gate electrode 125a, the switching gate electrode 125b, the compensation gate electrode 125c, and the initialization gate electrode 125d on the same layer. The first plate 126 and the second plate 127 may be formed of a gate wire including one or more metals of aluminum (Al), chromium (Cr), molybdenum (Mo), titanium (Ti), tantalum (Ta), an Al—Ni—La alloy, and an Al—Nd alloy. Therefore, the storage capacitance may be improved as compared to a structure where any one capacitive plate of the storage capacitor Cst is formed of the semiconductor layer.

Further, the driving voltage line 172 extends to overlap the storage capacitor Cst and also extends to cross the initialization voltage line 124, the prior scan line 122, and the initialization transistor T4. A portion of the driving voltage line 172 corresponds to the operation control source electrode 176e and is connected through the contact hole 71 to the operation control source region 132e. Another portion of the driving voltage line 172 is connected through a contact hole 66 formed in the interlayer insulating layer 160 to the second plate 127.

The connection member 174 is formed in parallel with the driving voltage line 172 on the same layer. The connection member 174 connects the driving gate electrode 125a and the first plate 126 to each other. A first end 174a of the connection member 174 is connected, through a contact hole 67 formed in the interlayer insulating layer 160, to the driving gate electrode 125a. A second end 177d of the connection member 174 corresponds to the initialization drain electrode 177d of the initialization transistor T4. The second end 177d of the connection member 174 is connected, through the contact hole 63 continuously formed in the first gate insulating layer 141, the second gate insulating layer 142, and the interlayer insulating layer 160, to the initialization semiconductor layer 131d of the initialization transistor T4.

Further, a middle protruding portion 177c of the connection member 174 corresponds to the compensation drain electrode 177c of the compensation transistor T3. The middle protruding portion 177c of the connection member 174 is connected, through a contact hole 68 continuously formed in the first gate insulating layer 141, the second gate insulating layer 142, and the interlayer insulating layer 160, to the compensation semiconductor layer 131c of the compensation transistor T3. Further, the middle protruding portion 177c of the connection member 174 is connected, through the contact hole 68 formed in the second gate insulating layer 142 and the interlayer insulating layer 160 positioned in a storage opening 127a, to the first plate 126.

Accordingly, the first plate 126 of the storage capacitor Cst is connected, through the middle protruding portion 177c and the other end 177d of the connection member 174, to the compensation semiconductor layer 125c and the initialization semiconductor layer 125d, respectively. The first plate o126 of the storage capacitor Cst is also connected, through one end 174a of the connection member 174, to the driving gate electrode 125a. In addition, the second plate 127 of the storage capacitor Cst is connected, through the contact hole 66 formed in the interlayer insulating layer 160, to the driving voltage line 172. In this case, the opening 127a, through which the middle protruding portion 177c of the connection member 174 and the first storage capacitive plate 126 are connected to each other, is formed in the second plate 127.

Accordingly, the storage capacitor Cst stores a storage capacitance corresponding to a difference between the driving voltage ELVDD transferred through the driving voltage line 172 and the gate voltage of the driving gate electrode 125a.

The switching transistor T2 is used as a switching element for selecting a pixel that is to emit light. The switching gate electrode 125b is connected to the scan line 121, the switching source electrode 176b is connected to the data line 171, and the switching drain electrode 177b is connected to the driving transistor T1 and the operation control transistor T5. In addition, the light emission control drain electrode 177f of the light emission control transistor T6 is directly connected, through a contact hole 181 formed in a protective layer 180, to a pixel electrode 191 of an organic light emitting diode 70.

FIGS. 4 and 5 illustrate an embodiment of a structure of the organic light emitting diode display which includes the driving transistor T1, the switching transistor T2, and the light emission control transistor T6. Also, in this structure, the compensation transistor T3 is the same as most of the deposition structure of the switching transistor T2, the initialization transistor T4 is the same as most of the deposition structure of the driving transistor T1, and the operation control transistor T5 is the same as most of the deposition structure of the light emission control transistor T6.

A barrier layer 120 is formed on a substrate 110, which may be a flexible substrate made of a material such as a plastic and/or polyimide layer.

Also, the driving semiconductor layer 131a, the switching semiconductor layer 131b, and the light emission control semiconductor layer 131f are formed on the barrier layer 120. The driving semiconductor layer 131a includes a driving channel region 131a1, and the driving source region 176a and the driving drain region 177a facing each other with the driving channel region 131a1 interposed therebetween. The switching semiconductor layer 131b includes a switching channel region 131b1, and a switching source region 132b and the switching drain region 177b facing each other with the switching channel region 131b1 interposed therebetween. The light emission control transistor T6 includes a light emission control channel region 131f1, the light emission control source region 176f, and a light emission control drain region 133f.

The first gate insulating layer 141 may be formed of, for example, silicon nitride (SiNx) or silicon oxide (SiO$_2$) and may be formed on the switching semiconductor layer 131a, the driving semiconductor layer 131b, and the light emission control semiconductor layer 131f.

The first gate wire (121, 123, 124, 125b, 125c, 125e, 125f, and 126) including the scan line 121 including the switching gate electrode 125b and the compensation gate electrode 125c, the light emission control line 123 including the operation control gate electrode 125e and the light emission control gate electrode 125f, the initialization voltage line 124, and the first plate 126 is formed on the first gate insulating layer 141.

The second gate insulating layer 142 is formed on the first gate wire (121, 123, 124, 125b, 125c, 125e, 125f, and 126) and the first gate insulating layer 141. The second gate insulating layer 142 includes a lower gate insulating layer 1421 formed on the first gate insulating layer 141, a crack blocking layer 1423 formed on the lower gate insulating layer 1421, and an upper gate insulating layer 1422 formed on the crack blocking layer 1423.

The lower gate insulating layer 1421 and the upper gate insulating layer 1422 may be formed of silicon nitride (SiNx) or silicon oxide (SiO$_2$), and the crack blocking layer 1423 may be formed of, for example, a natural oxide layer. In accordance with one embodiment, the crack blocking layer 1423 may be formed of the natural oxide layer during a time interval when forming the second lower gate insulating layer 1421 and the second upper gate insulating layer 1422. Examples of the crack blocking layer include $TiO_2$, $Ta_2O_5$, $BaTiO_3$, $SrTiO_3$, $Bi_4Ti_3O_{12}$, and $PbTiO_3$.

As shown in FIG. 6, the crack blocking layer prevents a crack (C) from migrating to the storage capacitor as a result of one or more particles 1 formed when the barrier layer 120 (made of, for example, the polyimide layer) is deposited. Prohibiting the crack from reaching and/or extending into the layers of the storage capacitor, in turn, prevents a capacitance leakage passage from being formed, which can degrade performance of the pixel.

The second gate wire (122, 125a, and 127) including the driving gate electrode 125a, the prior scan line 122, and the second plate 127 is formed on the second gate insulating layer 142.

As described above, the first gate insulating layer 141 and the second gate insulating layer 142 are formed between the driving semiconductor layer 131a and the driving gate electrode 125a. The first and second gate insulating layers 141 and 142 increase an interval between the driving semiconductor layer 131a and the driving gate electrode 125a. Accordingly, a driving range of the gate voltage applied to the driving gate electrode 125a may be increased, which, in turn, allows for an increase in grayscale range of the display.

The interlayer insulating layer 160 is formed on the second gate wire (122, 125a, and 127) and the second gate insulating layer 142. Like the first gate insulating layer 141, the interlayer insulating layer 160 may be made of, for example, a ceramic-based material such as silicon nitride (SiNx) or silicon oxide (SiO$_2$).

Data wires including the data line 171 (with the switching source electrode 176b, the connection member 174 including the initialization drain electrode 177d and the compensation drain electrode 177c, the light emission control drain electrode 1770 and the driving voltage line 172 (including the driving control source electrode 176e) are formed on the interlayer insulating layer 160.

In addition, the light emission control drain electrode 177f is connected, through a contact hole 72 formed in the first gate insulating layer 141, the second gate insulating layer 142, and the interlayer insulating layer 160, to the light emission control drain region 133f of the light emission control semiconductor layer 131f. The middle protruding portion 177c of the connection member 174 is connected, through the contact hole 68 continuously formed in the second gate insulating layer 142 and the interlayer insulating layer 160, to the first plate 126. The middle protruding portion 177c of the connection member 174 is also connected, through the contact hole 68 continuously formed in the first gate insulating layer 141, the second gate insulating layer 142, and the interlayer insulating layer 160, to the compensation semiconductor layer 131c of the compensation transistor T3.

The protective layer 180 covering the data wires 171, 172, 174, and 177f is formed on the interlayer insulating layer 16. The pixel electrode 191 is formed on the protective layer 180 and is connected, through the contact hole 181 formed in the protective layer 180, to the light emission control drain electrode 177f.

A barrier rib 350 is formed on an edge of the pixel electrode 191 and the protective layer 180. The barrier rib 350 has a barrier rib opening 351 through which the pixel electrode 191 is exposed. The barrier rib 350 may be made of a resin such as, for example, a polyacrylate and a polyimide, or silica-based inorganic materials.

An organic emission layer 370 is formed on the pixel electrode 191 exposed through the barrier rib opening 351, and a common electrode 270 is formed on the organic emission layer 370. The organic light emitting diode 70 (including the pixel electrode 191, the organic emission layer 370, and the common electrode 270) is formed as described above.

In accordance with one embodiment, the pixel electrode 191 is an anode that is a hole injection electrode and the common electrode 270 is a cathode that is an electron injection electrode. In other embodiments, the pixel electrode 191 may be the cathode and the common electrode 270 may be the anode. Holes and electrons are injected from the pixel electrode 191 and the common electrode 270 into the organic emission layer 370. When excitons, formed by combinations of the injected holes and electrons, fall from an exited state to a ground state, light is emitted.

The organic emission layer 370 may be formed of, for example, a low molecular weight organic material or a high molecular weight organic material such as PEDOT (poly(3, 4-ethylenedioxythiophene)). Further, the organic emission layer 370 may be formed of, for example, a multilayer including one or more of an emission layer, a hole injection layer HIL, a hole transport layer HTL, an electron transport layer ETL, and an electron injection layer EIL. In the case where all the layers are included, the hole injection layer HIL may be disposed on the pixel electrode 191 that is the anode, and the hole transport layer HTL, the emission layer, the electron transport layer ETL, and the electron injection layer EIL may be sequentially laminated thereon.

The organic emission layer 370 may include: a red organic emission layer emitting light having a red color, a green organic emission layer emitting light having a green color, and a blue organic emission layer emitting light having a blue color. The red organic emission layer, the green organic emission layer, and the blue organic emission layer may be respectively formed in a red pixel, a green pixel, and a blue pixel to implement a color image.

In one embodiment, the organic emission layer 370 may implement the color image by laminating the red organic emission layer, the green organic emission layer, and the blue organic emission layer in the red pixel, the green pixel, and the blue pixel together, forming a red color filter, a green color filter, and a blue color filter for each pixel.

In another embodiment, a white organic emission layer emitting light having a white color may be formed in the red pixel, the green pixel, and the blue pixel, and a red color filter, green color filter, and blue color filter may be formed for each pixel to implement the color image.

In another embodiment, a color image may be implemented using a white organic emission layer. The color filters, deposition masks for depositing the red organic emission layer, the green organic emission layer, and the blue organic emission layer on each pixel, that is, the red pixel, the green pixel, and the blue pixel, may not be used.

The white organic emission layer in another embodiment may be formed of one organic emission layer, and may include a constitution in which a plurality of organic emission layers are laminated to emit light having white color. Additional embodiments include an embodiment in which at least one yellow organic emission layer and at least one blue organic emission layer are combined to emit light having the white color, an embodiment in which at least one cyan organic emission layer and at least one red organic emission layer are combined to emit light having the white color, and an embodiment in which at least one magenta organic emission layer and at least one green organic emission layer are combined to emit light having the white color.

A sealing member for protecting the organic light emitting diode 70 may be formed on the common electrode 270, may be sealed by a sealant on the substrate 110, and may be formed of various materials such as glass, quartz, ceramic, plastics, and metal. Meanwhile, a sealing thin film layer may be formed by depositing an inorganic layer and an organic layer on the common electrode 270 while not using the sealant.

Several approaches have been proposed in attempt to control grayscale range. One approach involves using a driving range expansion structure. In such a structure, a first gate insulating layer and a second gate insulating layer are formed between a gate electrode and a semiconductor layer of the driving transistor. These layers are formed to widen the driving range of the gate voltage of the driving transistor. However, such an approach has proven to have significant drawbacks.

For example, a driving range expansion structure formed in a flexible OLED display may involve forming a polyimide (or barrier) layer as a first gate insulating layer under the semiconductor layer. The polyimide (or barrier) layer may be formed by depositing the layer in a liquid state having high viscosity and then allowing it to harden. During the hardening process, particles may form which may promote the formation of cracks in the first gate insulating layer. These cracks may cause defects in the second gate insulating layer. When the second gate insulating layer also serves as the dielectric material of a pixel storage capacitor, a capacitance leakage passage may be formed, which degrades performance.

In accordance with one or more embodiments, an organic light emitting diode display is provided that prevents a capacitance leakage passage in a driving range expansion structure, in which a first gate insulating layer and a second gate insulating layer are between a gate electrode and a semiconductor layer of a driving transistor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An organic light emitting diode display, comprising:
a substrate;

a semiconductor layer on the substrate and including a switching semiconductor layer and a driving semiconductor layer separated from each other;
a first gate insulating layer over the semiconductor layer;
a switching gate electrode on the first gate insulating layer and overlapping the switching semiconductor layer;
a second gate insulating layer over the switching gate electrode;
a driving gate electrode on the second gate insulating layer, overlapping the driving semiconductor layer, and having a first surface facing the substrate; and
an interlayer insulating layer over the driving gate electrode and the second gate insulating layer, wherein the second gate insulating layer includes:
a second lower gate insulating layer on the first gate insulating layer,
a crack blocking layer on the second lower gate insulating layer, the crack blocking layer extending from a first region to a second region, the first region between plates of a storage capacitor and the second region between the storage capacitor and a third region, and
a second upper gate insulating layer on the crack blocking layer, wherein the first surface contacts the second gate insulating layer.

2. The display as claimed in claim 1, wherein the substrate includes a polyimide.

3. The display as claimed in claim 1, further comprising a barrier layer between the substrate and the semiconductor layer.

4. The display as claimed in claim 1, wherein the storage capacitor includes a first plate on the first gate insulating layer and a second plate on the second gate insulating layer overlapping the first plate.

5. The display as claimed in claim 4, further comprising:
a scan line on the substrate and transmitting a scan signal;
a data line and a driving voltage line crossing the scan line, the data line and driving voltage line respectively transmitting a data signal and a driving voltage;
a switching transistor coupled to the scan line and the data line, the switching transistor including the switching semiconductor layer and the switching gate electrode;
a driving transistor coupled to a switching drain electrode of the switching transistor, the driving transistor including the driving semiconductor layer and the driving gate electrode; and
an organic light emitting diode coupled to a driving drain electrode of the driving transistor.

6. The display as claimed in claim 5, wherein the crack blocking layer includes a natural oxide layer.

7. A pixel, comprising:
a transistor;
a capacitor coupled to the transistor;
a first insulating layer over a semiconductor layer of the transistor;
a second insulating layer over the first insulating layer; and
a blocking layer between the first insulating layer and the second insulating layer,
wherein the blocking layer extends from a first region to a second region, the first region between plates of the capacitor and the second region between the capacitor and a third region, the second region and the third region not overlapping either plate of the capacitor, and
wherein a first plate of the capacitor is on the first insulating layer and a second plate of the capacitor on the second insulating layer, and wherein the blocking layer is made of a natural oxide layer and the first insulating layer is made of a material different from the blocking layer.

8. The pixel as claimed in claim 7, wherein the semiconductor layer includes:
a switching semiconductor layer spaced from a driving semiconductor layer,
wherein the switching semiconductor layer or the driving semiconductor layer corresponds to the transistor coupled to the capacitor.

9. The pixel as claimed in claim 7, wherein the transistor is a switching transistor of the pixel.

10. The pixel as claimed in claim 9, further comprising:
a driving transistor, wherein the first and second insulating layers are gate insulating layers of the driving transistor.

11. The pixel as claimed in claim 10, further comprising:
a gate electrode on the first insulating layer.

12. The pixel as claimed in claim 11, wherein the second insulating layer is over the gate electrode.

13. The pixel as claimed in claim 10, wherein:
the driving transistor includes a gate electrode,
the gate electrode is on the first insulating layer, and
the second insulating layer is over the gate electrode.

14. The pixel as claimed in claim 7, wherein the first insulating layer includes silicon.

15. The pixel as claimed in claim 7, further comprising:
an organic light emitting diode coupled to at least one node of the capacitor.

16. A pixel, comprising:
a driving transistor;
a switching transistor;
a capacitor between a node of the switching transistor and a node of the driving transistor;
a first insulating layer over a semiconductor layer of the switching and driving transistors;
a second insulating layer over the first insulating layer; and
a blocking layer between the first and second insulating layers, wherein the blocking layer extends from a first region to a second region, the first region between plates of the capacitor and the second region between the capacitor and a third region, the second region and the third region not overlapping either plate of the capacitor, and wherein a first plate of the capacitor is on the first insulating layer and a second plate of the capacitor on the second insulating layer.

17. The pixel as claimed in claim 16, wherein the blocking layer is made from a material which prevents a crack in the first insulating layer from migrating to the second insulating layer.

18. The pixel as claimed in claim 16, wherein:
the blocking layer is made of a natural oxide layer, and
the first insulating layer is made of a material different from the blocking layer.

19. The pixel as claimed in claim 16, wherein first and second insulating layers are insulating layers of a gate of the switching transistor or the driving transistor.

20. The pixel as claimed in claim 16, further comprising:
another insulating layer between the blocking layer and the first plate of the capacitor.

* * * * *